(12) United States Patent
Landt et al.

(10) Patent No.: US 7,969,701 B1
(45) Date of Patent: Jun. 28, 2011

(54) FAST REACT PROTECTION CIRCUIT FOR SWITCHED MODE POWER AMPLIFIERS

(75) Inventors: Don L. Landt, Palo, IA (US); Allen W. Jones, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 12/572,681

(22) Filed: Oct. 2, 2009

(51) Int. Cl.
*H02H 3/20* (2006.01)
*H02H 9/04* (2006.01)

(52) U.S. Cl. ........................ 361/91.4; 361/91.1

(58) Field of Classification Search ............ 361/91.4
See application file for complete search history.

(56) References Cited

U.S. PATENT DOCUMENTS 4,630,164 A * 12/1986 Olsson .................. 361/91.6
7,724,065 B2 * 5/2010 Bayerer et al. ........... 327/375

* cited by examiner

*Primary Examiner* — Dharti H Patel
(74) *Attorney, Agent, or Firm* — Matthew J. Evans; Daniel M. Barbieri

(57) ABSTRACT

A protection circuit includes a diode chip, and a switching device integrated with the diode chip, the switching device being isolated, optically triggered, optically powered, and the diode chip connected between a high side terminal of the switching device and an input to a first inverting amplifier, the diode chip further supplying a current when an overvoltage occurs between a drain and a source of the switching device.

18 Claims, 2 Drawing Sheets

FAST REACT PROTECTION CIRCUIT FOR SWITCHED MODE POWER AMPLIFIERS

FIELD

The present disclosure relates generally to protection circuits. Specifically, the present disclosure relates to protecting series connected semiconductor switching devices when used in switched mode power amplifiers.

BACKGROUND

Systems requirements for high power RF, Microwave and Millimeter Power Amplifiers have forced PA designers to use larger power transistor devices (in terms of total gate width or emitter area) to obtain the specified power levels. As device sizing becomes larger and larger, fabrication yields drop, device terminal impedances become very low, and transmit bandwidths become limited with realizable matching circuits.

SUMMARY

Accordingly, the various embodiments of the present disclosure are directed to a protection circuit.

Accordingly, an embodiment of the present disclosure is directed to a protection circuit including a diode chip, and a switching device integrated with the diode chip, the switching device being isolated, optically triggered, optically powered, and the diode chip connected between a high side terminal of the switching device and an input to a first inverting amplifier, the diode chip further supplying a current when an overvoltage occurs between a drain and a source of the switching device.

It is to be understood that both the foregoing general description and the following detailed description are exemplary and explanatory only and are not restrictive of the invention claimed. The accompanying drawings, which are incorporated in and constitute a part of the specification, illustrate an embodiment of the disclosure and together with the general description, serve to explain the principles of the disclosure.

BRIEF DESCRIPTION OF THE DRAWINGS

The numerous objects and advantages of the present disclosure may be better understood by those skilled in the art by reference to the accompanying figures in which.

DETAILED DESCRIPTION

Reference will now be made in detail to presently preferred embodiments of the disclosure, examples of which are illustrated in the accompanying drawings.

Figure 1:
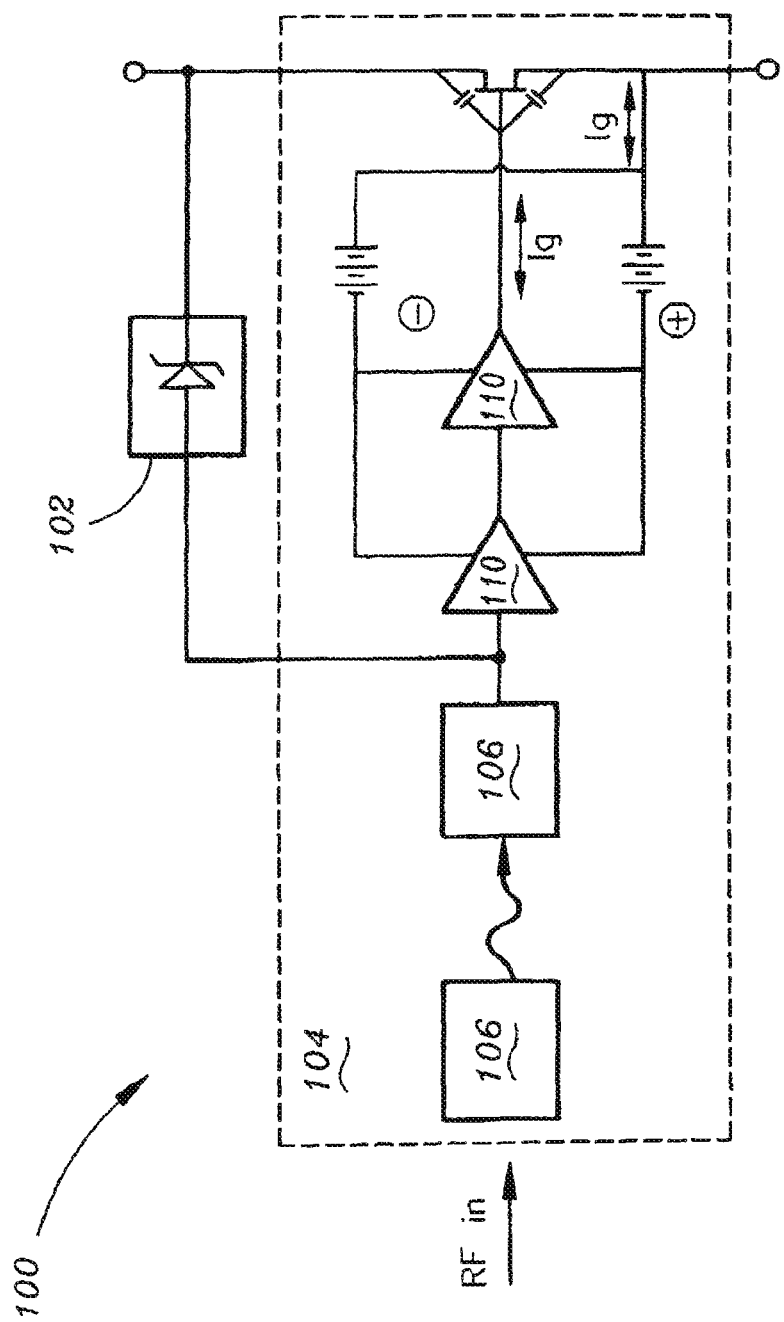
FIG. 1 is a schematic diagram of a protection circuit according to an exemplary embodiment of the disclosure.

Referring to FIG. 1, schematic diagram of a protection circuit 100 is described in accordance with exemplary embodiments of the present disclosure. A protection circuit 100 may include a diode chip 102, and a switching device 104 integrated with the diode chip 102. As discussed below, the switching device 104 may be isolated, optically triggered, and optically powered. The diode chip 102 may be connected between a high side terminal of the switching device 104 and an input to a first inverting amplifier 110, the diode chip 102 further supplying a current when an overvoltage occurs between a drain and a source of the switching device 104.

The diode chip 102 may be a clamping diode, and may further be an avalanche diode or a zener diode. In an embodiment utilizing an avalanche diode, the avalanche diode may be connected to the switching device 104 so that the avalanche diode is reverse-biased. The diode chip 102 provides minimal terminal and connection parasitics between the diode and the switching device (e.g., transistor) bias terminal.

The switching device is 104 combined in series to provide very high output powers and deliver power to an approximately 50 ohm load without the use of matching structures. The switching device 104 includes at least two inverting amplifiers 110 providing the current necessary to change the switch state (e.g., to change the output switching device from the full "on" state to completely "off" state) in approximately a time period and on an order of magnitude shorter than the period of the RF output signal.

In one embodiment, the protection circuit 100 includes an extremely high speed avalanche diode 102 and an optically-triggered, optically-powered, isolated, switching element OSISE switch 104 integrated with the avalanche diode 104, the OSISE switch being isolated, optically triggered, optically powered, the avalanche diode connected between the high side terminal of the switching device and the input to the first inverting amplifier and supplies this current when an overvoltage occurs between the drain and source of the OSISE switching device 104.

The OSISE switching device 104 may be combined in series to provide very high output power and deliver power to an approximately 50 ohm load without the use of matching structures.

The avalanche diode 102 may be in die form, or may be a monolithically fabricated diode, minimizing parasitic capacitance from the diode to ground. The avalanche diode 102 may include a P type anode region adjacent to and intersecting an N type cathode region. A cathode region may overlap a drain region. The anode region may include a P+ anode contact region at the surface of the substrate. The anode contact region may be electrically connected by interconnects with the P contact for the body of the transistor. This places the avalanche diode in parallel with the lateral PN diode formed by the body and the drain.

One or more switching devices 104 may be series connected, providing the equally shared current in the series connected devices between all the elements. Voltage across each leg of the output stage is equally shared by the element contained in the leg when the series switching devices 104 are turned to the off state.

The protection circuit 100 provides protection against switching device 104 failure in an operational state. Protection circuit 100 minimizes drive timing variations straying outside of the dead time between pulsed drive excitation of the switching device 104.

During operation, the protection circuit 100 may be turned on, and may draw current when the voltage across the switch reaches a certain value. The value may be less than or equal to the inherent breakdown voltage of the switch.

An OSISE switch in the protection circuit 100 may be voltage limited. Thus in a series string of one or more OSISE switching devices 104 operating in a power amplifier with a total supply voltage of Vsup, the total voltage across any "on" OSISE switching device 104 is approximately Vsup/N as determined by the inherent breakdown of the avalanche diode 102 integrated with each OSISE switching device 104.

The protection circuit 100 provides reliable operation of extremely high power, high frequency switch mode amplifiers running, for example, in a Class D push-pull topology. The protection circuit 100 protects an output power transistor array from composite failure and protects one or more individual power transistors from localized transients or drive timing anomalies. The protection circuit 100 provides reliable operation of a class of power amplifiers with a ×4 size and weight reduction and a 2× efficiency improvement over legacy Power Amplifier systems.

Figure 2:
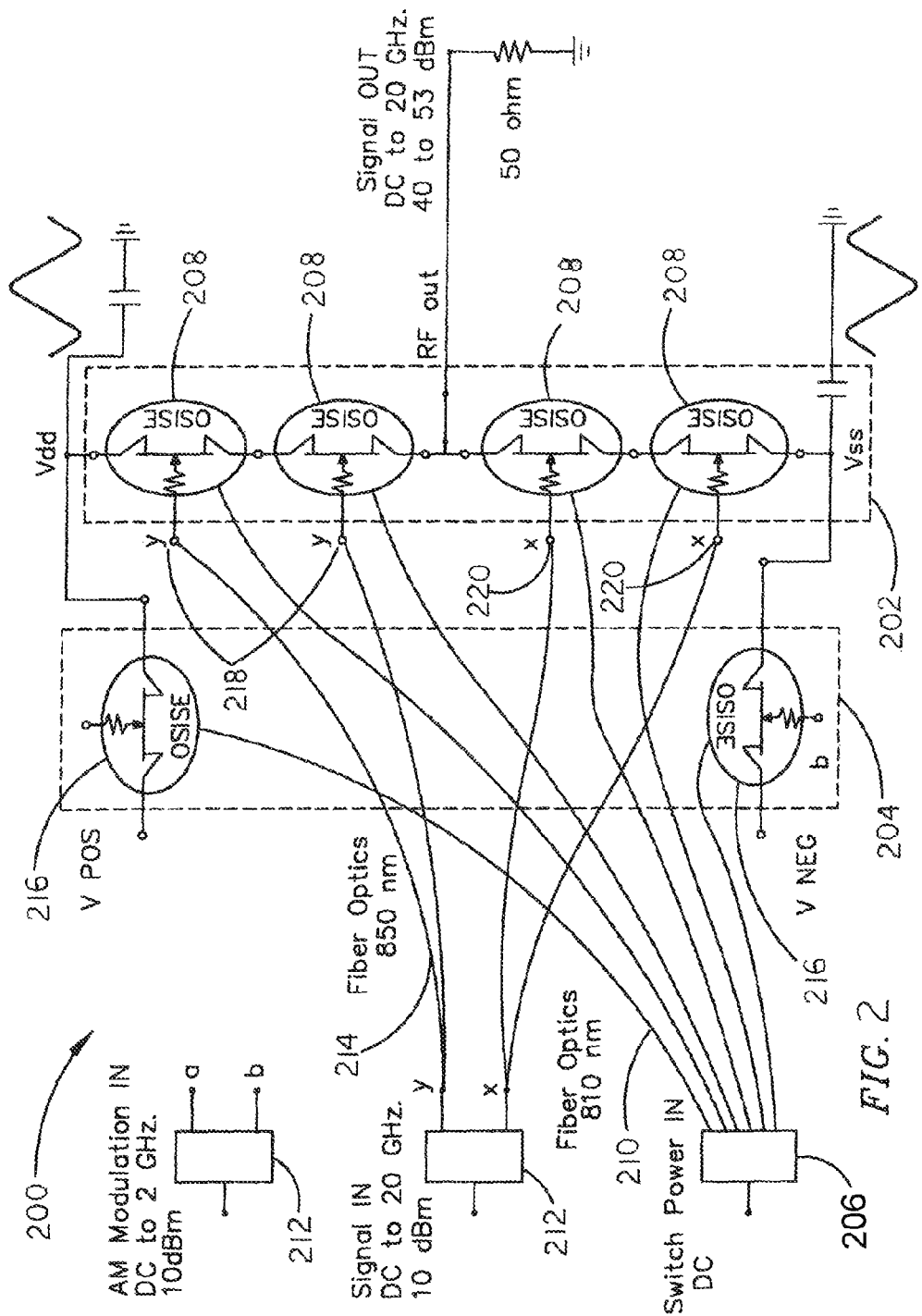
FIG. 2 is a schematic diagram of an optically-triggered, optically-powered, isolated, switching element (OSISE) according to an exemplary embodiment of the present disclosure.

Referring to FIG. 2, a schematic diagram of an optically-triggered, optically-powered, isolated, switching element (OSISE) according to an exemplary embodiment of the present disclosure is shown. A switching assembly 200 provides for extremely fast switch times, high current and high voltage while maintaining isolation of switching elements from surrounding structures and devices. The switching device 200 may operate as a complementary output stage similar to CMOS while using only n-type devices. The switching assembly 200 is implemented within a power amplifier or a mixer and comprises a switching circuit 202. Further, the switching assembly 200 may be a monolithic integrated circuit. The switching assembly 200 may include a first plurality of switching elements 208. Further, the plurality of switching elements 208 may include at least one x switch 220 and at least on y switch 218. The first plurality of switching elements 108 may be Gallium Nitride (GaN) based switches. The first plurality of switching elements may be optically coupled between the ports and may be optically powered. For example, the first plurality of switching element 208 may be optically powered via a first optical link 210. For example, the first optical link 210 may employ a fiber optic cable and operate at an optical wavelength of 810 nm. The first plurality of switching elements 208 may be configured for optical link triggering. For example, the first plurality of switching elements 108 may be triggered by a signal from a second optical link 214. In one embodiment, the first plurality of switching elements 208 may be optically triggered via a triggering signal from a signal phase 212 supplied to the first plurality of switching elements via an alternate high-speed, optical link 214. The second optical link 214 may employ a fiber optic cable and operate at an optical wavelength of about 850 nm. The first plurality of switching elements 208 may be pulled to a rail voltage $V_{dd}$ or $V_{ss}$ upon receiving a trigger via the second optical link 214.

The "Y" switches included in the first plurality of switching elements are either off or pulled to the rail voltage $V_{dd}$. In a similar fashion, the "X" switches included in the first plurality of switching element are either off or pulled to the rail voltage $V_{ss}$.

The charging circuit 204 comprises a second plurality of switching elements 210. The second plurality of switching elements 216 includes at least one "A" switch and at least one "B" switch. The "A" and "B" switches included in the second plurality of switching elements may be configured as charge pumps for producing rail voltages $V_{dd}$ and $V_{ss}$ in sync with AM modulation. The "A" and "B" switches correspond to a positive voltage and a negative voltage respectively. The second plurality of switching elements 216 may receive power via an optical link. For example, the optical power link 210 may operate at an optical wavelength of 810 nm. Further, the second plurality of switching elements 116 may be optically coupled to the AM modulation Driver 222 with optical cable running at an optical frequency of 850 nm. A feedback loop from the $V_{dd}$ source to the AM Modulator Driver 222 would be implemented to maintain accurate control of the rail voltage and in turn the amplitude of the AM modulated signal.

Still further the second plurality of switching elements 216 may be Gallium Nitride (GaN) based switches.

The power supply 206 includes of laser diodes driven from a DC switching power supply. The power supply 206 includes a power in port configured for converting one DC voltage level to another. The power supply 106 is configured for supplying power to the first plurality of switching elements and the second plurality of switching elements via an optical link. The power supply 206 may be configured with a plurality of independent optical links for supplying power to each of the first plurality of switching elements 208 and the second plurality of switching elements 216.

In one specific embodiment, the second plurality of switching elements 216 receives a carrier signal of DC to 2 Ghz via an optical link from port A on the AM Modulation Driver 222 to port A on the switching element 216. Utilizing AM Modulation Driver 222 the "A" switch included in the second plurality of switching elements 216 receives a pulse-width modulated signal that replicates the desired amplitude modulation of the signal on the $V_{dd}$ rail. The "B" switch included in the second plurality of switching elements 216 receives a pulse-width modulated signal that replicates a 180 degree out of phase signal of the desired amplitude modulation on the $V_{ss}$ rail.

Systems and apparatuses in accordance with various aspects of the present disclosure provide an improved integrated circuit. In this regard, the present disclosure may be described herein in terms of functional block components and various processing steps. It should be appreciated that such functional blocks may be realized by any number of hardware, firmware, and/or software components configured to perform the specified functions. For example, the present disclosure may employ various integrated circuit components, e.g., memory elements, digital signal processing elements, look-up tables, and the like, which may carry out a variety of functions under the control of one or more microprocessors or other control devices. Such general techniques and components that are known to those skilled in the art are not described in detail herein. Furthermore, although the disclosure is frequently described herein as pertaining to MMIC devices, it will be appreciated that the systems and methods described herein could also be applied to a D-class power amplifier.

It is to be noted that the foregoing described embodiments according to the present disclosure may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is believed that the present disclosure and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

The invention claimed is:

1. A protection circuit comprising:
   a diode; and
   a switching device integrated with the diode, the switching device being isolated, optically triggered, and optically powered, and the diode being connected between a high side terminal of the switching device and an input to a first inverting amplifier, the diode further supplying a current when an overvoltage occurs between a drain and a source of the switching device.

2. The protection circuit of claim 1, wherein the diode is an avalanche diode.

3. The protection circuit of claim 1, wherein the diode is a zener diode.

4. The protection circuit of claim 1, wherein the diode provides minimal terminal and connection parasitics between the diode and a switching device bias terminal.

5. The protection circuit of claim 1, wherein the switching device is combined in series to provide very high output power and deliver power to an approximately 50 ohm load without the use of matching structures.

6. The protection circuit of claim 1, wherein the switching device includes at least two inverting amplifiers providing the current necessary to change the switch state of the switching device in approximately a time period and on an order of magnitude shorter than the period of the RF output signal.

7. The protection circuit of claim 1, wherein the diode is in die form, or is a monolithically fabricated diode.

8. The protection circuit of claim 1, wherein the switching device is voltage limited.

9. A protection circuit comprising:
a plurality of switching devices; and
a plurality of diodes, each of the plurality of switching devices being isolated, optically triggered, and optically powered, each of the plurality of diodes being connected between a high side terminal of the switching device and an input to a first inverting amplifier, each of the plurality of diodes further supplying a current when an overvoltage occurs between a drain and a source of each of the plurality of switching devices.

10. The protection circuit of claim 9, wherein the plurality of switching devices are series connected.

11. The protection circuit of claim 9, wherein each of the plurality of diodes draws current when voltage across the switching device reaches a certain value.

12. The protection circuit of claim 9, wherein at least one of the plurality of diodes is an avalanche diode.

13. The protection circuit of claim 9, wherein at least one of the plurality of diodes is a zener diode.

14. The protection circuit of claim 9, wherein each of the plurality of diodes provides minimal terminal and connection parasitics between a diode and a switching device bias terminal.

15. The protection circuit of claim 9, wherein each of the plurality of switching devices is combined in series to another of the plurality of switching devices to provide very high output power and deliver power to an approximately 50 ohm load without use of matching structures.

16. The protection circuit of claim 9, wherein each of the plurality of switching devices includes at least two inverting amplifiers providing the current necessary to change the switch state of the switching device in approximately a time period and on an order of magnitude shorter than the period of the RF output signal.

17. The protection circuit of claim 9, wherein each of the plurality of diodes is in die form, or is a monolithically fabricated diode.

18. The protection circuit of claim 9, wherein each of the plurality of switching devices is voltage limited.

* * * * *